(12) United States Patent
Bergervoet et al.

(10) Patent No.: US 10,090,295 B2
(45) Date of Patent: Oct. 2, 2018

(54) BIASED TRANSISTOR MODULE

(71) Applicant: NXP B.V., Eindhoven (NL)

(72) Inventors: Jozef Reinerus Maria Bergervoet, Eindhoven (NL); Gerben Willem de Jong, Veldhoven (NL); Gian Hoogzaad, Mook (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/619,694

(22) Filed: Jun. 12, 2017

(65) Prior Publication Data

US 2018/0006021 A1 Jan. 4, 2018

(30) Foreign Application Priority Data

Jun. 30, 2016 (EP) .................................. 16177378

(51) Int. Cl.
*H03F 3/04* (2006.01)
*H01L 27/06* (2006.01)
*H03K 19/088* (2006.01)
*G11C 11/412* (2006.01)
*H03K 3/356* (2006.01)

(52) U.S. Cl.
CPC ........ *H01L 27/0652* (2013.01); *G11C 11/412* (2013.01); *H03K 3/356* (2013.01); *H03K 3/356104* (2013.01); *H03K 19/088* (2013.01)

(58) Field of Classification Search
CPC ................ H03F 3/04; H03F 3/20; H03G 3/30
USPC .................................................. 330/296, 285
See application file for complete search history.

(56) References Cited

U.S. PATENT DOCUMENTS

| | | | | |
|---|---|---|---|---|
| 3,673,507 | A * | 6/1972 | Prescott | ................. H03F 3/68 330/295 |
| 3,714,601 | A | 1/1973 | Minton et al. | |
| 4,225,827 | A | 9/1980 | Davis, Jr. | |
| 4,924,194 | A | 5/1990 | Opas et al. | |
| 7,504,887 | B2 * | 3/2009 | Masuda | ................. H03F 1/30 330/289 |
| 7,795,980 | B2 | 9/2010 | Griffiths et al. | |
| 8,138,836 | B2 * | 3/2012 | Matsuzuka | ............. H03F 3/16 330/285 |

(Continued)

FOREIGN PATENT DOCUMENTS

WO    WO-99/52192    10/1999
WO    WO-2004/055973 A1    7/2004

*Primary Examiner* — Henry Choe

(57) ABSTRACT

A biased-transistor-module comprising: a module-input-terminal; a module-output-terminal; a reference-terminal; a module-supply-terminal configured to receive a supply voltage; a module-reference-voltage-terminal configured to receive a module reference voltage; a main-transistor having a main-control-terminal, a main-first-conduction-channel-terminal and a main-second-conduction-channel-terminal, wherein the main-first-conduction-channel-terminal is connected to the module-output-terminal, and the main-second-conduction-channel-terminal is connected to the reference-terminal, and the main-control-terminal is connected to an input-signal-node, wherein the input-signal-node is connected to the module-input-terminal; and a bias-circuit. The bias-circuit comprises: a first-bias-transistor; a first-bias-resistor; a second-bias-transistor; and a second-bias-resistor.

16 Claims, 3 Drawing Sheets

(56) References Cited

U.S. PATENT DOCUMENTS

| | | | |
|---|---|---|---|
| 2003/0020545 A1* | 1/2003 | Joly | H03F 1/26 330/289 |
| 2005/0062541 A1 | 3/2005 | Kuriyama | |
| 2007/0236293 A1 | 10/2007 | Masuda et al. | |
| 2015/0295549 A1 | 10/2015 | Hirooka | |

* cited by examiner

BIASED TRANSISTOR MODULE

CROSS-REFERENCE TO RELATED APPLICATIONS

This application claims the priority under 35 U.S.C. § 119 of European patent application No. 16177378.3, filed Jun. 30, 2017 the contents of which are incorporated by reference herein.

The present disclosure relates to circuits with one or more transistors, and in particular, although not necessarily, to circuits or modules arranged to provide a bias voltage to a transistor.

According to a first aspect of the present disclosure there is provided a biased-transistor-module comprising:
  a module-input-terminal;
  a module-output-terminal;
  a reference-terminal;
  a module-supply-terminal configured to receive a supply voltage;
  a module-reference-voltage-terminal configured to receive a module reference voltage;
  a main-transistor having a main-control-terminal, a main-first-conduction-channel-terminal and a main-second-conduction-channel-terminal, wherein the main-first-conduction-channel-terminal is connected to the module-output-terminal, and the main-second-conduction-channel-terminal is connected to the reference-terminal, and the main-control-terminal is connected to an input-signal-node, wherein the input-signal-node is connected to the module-input-terminal; and
  a bias-circuit comprising:
    a first-bias-transistor having a first-bias-control-terminal, a first-bias-first-conduction-channel-terminal and a first-bias-second-conduction-channel-terminal;
    a first-bias-resistor;
    a second-bias-transistor having a second-bias-control-terminal, a second-bias-first-conduction-channel-terminal and a second-bias-second-conduction-channel-terminal; and
    a second-bias-resistor;
  wherein:
    the first-bias-first-conduction-channel-terminal is connected to the input-signal-node;
    the first-bias-second-conduction-channel-terminal is connected to the reference-terminal;
    the first-bias-resistor is connected between the first-bias-first-conduction-channel-terminal and the first-bias-control-terminal;
    the second-bias-second-conduction-channel-terminal is connected to the input-signal-node;
    the second-bias-first-conduction-channel-terminal is connected to the module-supply-terminal; and
    the second-bias-resistor is connected between the second-bias-control-terminal and the module-reference-voltage-terminal.

In one or more embodiments the biased-transistor-module further comprises a first-additional-capacitor connected between the first-bias-control-terminal and the first-bias-second-conduction-channel-terminal.

In one or more embodiments the biased-transistor-module may further comprise a second-additional-capacitor connected between the second-bias-second-conduction-channel-terminal.

In one or more embodiments the biased-transistor-module may further comprise:
  a first-reference-transistor having a first-reference-control-terminal, a first-reference-first-conduction-channel-terminal and a first-reference-second-conduction-channel-terminal;
  a second-reference-transistor having a second-reference-control-terminal, a second-reference-first-conduction-channel-terminal and a second-reference-second-conduction-channel-terminal; and
  a reference-current-terminal,
  wherein:
    the first-reference-first-conduction-channel-terminal may be connected to an intermediate-reference-node;
    the first-reference-second-conduction-channel-terminal may be connected to the reference-terminal;
    the first-reference-control-terminal may be connected to the intermediate-reference-node;
    the second-reference-second-conduction-channel-terminal may be connected to the intermediate-reference-node;
    the second-reference-first-conduction-channel-terminal may be connected to the module-reference-voltage-terminal;
    the second-reference-control-terminal may be connected to the module-reference-voltage-terminal; and
    the reference-voltage-terminal may be connected to the reference-current-terminal.

In one or more embodiments the biased-transistor-module may further comprise a reference-capacitor connected between the module-reference-voltage-terminal and the first-reference-second-conduction-channel-terminal.

In one or more embodiments the biased-transistor-module may further comprise a first-reference-resistor connected between the first-reference-control-terminal and the intermediate-reference-node.

In one or more embodiments the biased-transistor-module may further comprising a second-reference-resistor connected between the second-reference-control-terminal and the module-reference-voltage-terminal.

In one or more embodiments the biased-transistor-module may further comprising a voltage-offset-terminal connected to the first-bias-control-terminal, wherein the voltage-offset-terminal may be configured to provide an offset voltage to the biased-transistor-module.

In one or more embodiments the biased-transistor-module may further comprise a first-offset-resistor connected between the voltage-offset-terminal and the first-bias-control-terminal.

In one or more embodiments the biased-transistor-module may further comprise a second-offset-resistor connected between the voltage-offset-terminal and the first-reference-control-terminal.

In one or more embodiments the main-transistor may comprise a main-area, the first-bias-transistor may comprise a first-area and the second-bias-transistor may comprise a second-area, and:
  the ratio of the main-area to the first-area may be greater than 2, 5, 10 or 20; and/or
  the ratio of the main-area to the second-area may be greater than 2, 5, 10 or 20.

In one or more embodiments the ratio of the main-area to the first-area may be greater than 5. In one or more embodiments the ratio of the main-area to the second-area may be greater than 5. In one or more embodiments the ratio of the main-area to the first-area may be greater than 10. In one or more embodiments the ratio of the main-area to the second-area may be greater than 10. In one or more embodiments the ratio of the main-area to the first-area may be greater than 20. In one or more embodiments the ratio of the main-area to the second-area may be greater than 20.

In one or more embodiments the biased-transistor-module may further comprise an input-capacitor connected in series between the input-signal-node and the module-input-terminal.

In one or more embodiments the first-bias-transistor may be configured to provide current to cancel an avalanche current generated by the main-transistor.

There may be provided a system comprising:
- a plurality of any biased-transistor-modules disclosed herein;
- a system-supply-terminal;
- a system-reference-terminal;
- a system-input-terminal; and
- a system-output-terminal, wherein:
- each module-supply-terminal, of each of the plurality of biased-transistor-modules, may be connected to the system-supply-terminal;
- each reference-terminal, of each of the plurality of biased-transistor-modules, may be connected to the system-reference-terminal;
- each of the plurality of the biased-transistor-modules may be connected in cascade or parallel between the system-input-terminal and the system-output-terminal.

There may be provided a Class-C amplifier, or a Doherty amplifier, comprising any biased-transistor-module disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

A transistor circuit may be used to amplify a signal provided to the base, or control, terminal of a transistor. To improve the efficiency of operation of such a transistor, a bias circuit may be connected to the base terminal in order to supply a bias voltage.

Figure 1:
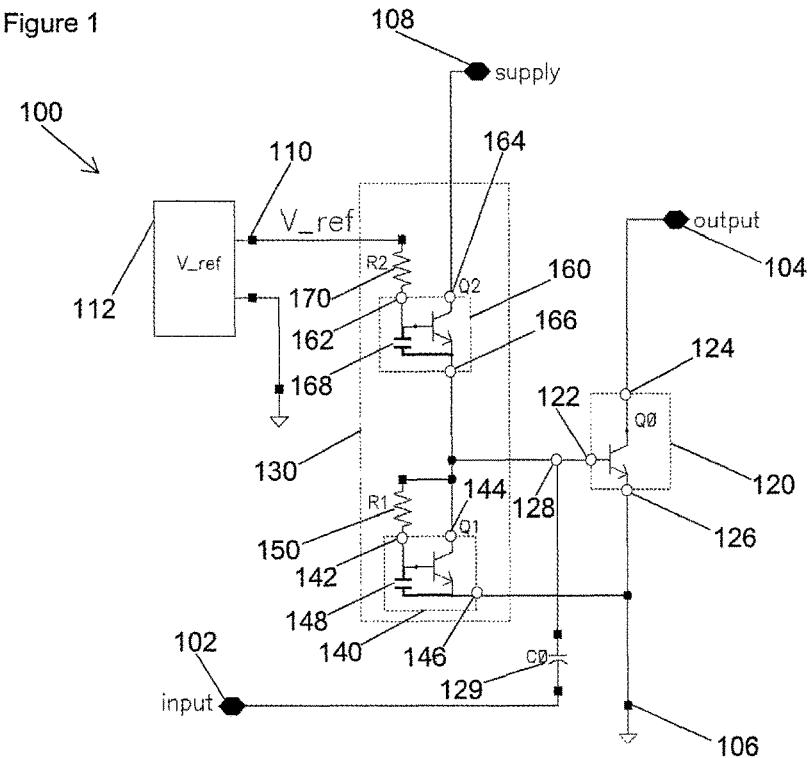
FIG. 1 shows an example embodiment of a biased transistor module.

FIG. 1 shows an example embodiment of a biased-transistor-module 100. The biased-transistor-module 100 includes a module-input-terminal 102, a module-output-terminal 104, and a main-transistor (Q0) 120. The main-transistor (Q0) 120 can be used to amplify an electronic signal received at the module-input-terminal 102, and provide the amplified electronic signal to the module-output-terminal 104.

The biased-transistor-module 100 also includes: a reference-terminal 106, which in this example is a ground terminal; a module-supply-terminal 108 configured to receive a supply voltage; and a module-reference-voltage-terminal 110. The module-reference-voltage-terminal 110 can receive a module reference voltage from a module-reference-voltage-source 112 in order to improve the stability of the voltage within parts of the biased-transistor-module 100.

The main-transistor 120 includes a main-base-terminal 122, a main-collector-terminal 124 and a main-emitter-terminal 126. The main-collector-terminal 124 is connected to the module-output-terminal 104 in order to provide the amplified electronic signal. The main-emitter-terminal 126 is connected to the reference-terminal 106. The main-base-terminal 122 is connected to an input-signal-node 128, which will be discussed in further detail below. The input-signal-node 128 is connected to: (i) the module-input-terminal 102 in order to receive an input signal that is to be amplified; and (ii) a bias circuit 130 for receiving a bias voltage.

The bias-circuit 130 can control a dc bias current that is provided to the main-base-terminal 122 of the main-transistor (Q0) 120. Equivalently, one may refer to a bias voltage that is responsible for generating the bias current. This bias current can enable the transistor to amplify alternating electric signals received at the module-input-terminal 102 without generating too much distortion.

The bias-circuit 130 in this example includes a first-bias-transistor 140, a first-bias-resistor 150, a second-bias-transistor 160, and a second-bias-resistor 170.

The first-bias-transistor 140 has a first-bias-base-terminal 142, a first-bias-collector-terminal 144 and a first-bias-emitter-terminal 146. The second-bias-transistor 160 has a second-bias-base-terminal 162, a second-bias-collector-terminal 164 and a second-bias-emitter-terminal 166. The first-bias-collector-terminal 144 is connected to the input-signal-node 128. The first-bias-emitter-terminal 146 is connected to the reference-terminal 106. The first-bias-resistor 150 is connected between the first-bias-collector-terminal 144 and the first-bias-base-terminal 142. The second-bias-emitter-terminal 166 is connected to the input-signal-node 128. The second-bias-collector-terminal 164 is connected to the module-supply-terminal 108. The second-bias-resistor 170 is connected between the second-bias-base-terminal 162 and the module-reference-voltage-terminal 110. In this way, the module-reference-voltage-source 112 provides the module reference voltage to the second-bias-base-terminal 162 of the second-bias-transistor 160 in the bias-circuit 130.

The first-bias-transistor (Q1) 140 can conduct current to absorb avalanche current that may be generated in the main-transistor (Q0) 120, such as can occur under load mismatch conditions. Such avalanche current can have a negative effect on the desired value of the bias voltage, and can impair the correct control of the bias current. Also, the avalanche current can damage the main-transistor 120. In the circuit of FIG. 1, any avalanche current that flows out of the base 122 of the main-transistor 120 can flow into the first-bias-collector-terminal 144 of the first-bias-transistor 140, and therefore to the reference-terminal 106 through the conduction path of the first-bias-transistor 140. Therefore, the likelihood of damaging the main-transistor 120 can be reduced, and the bias current can be well controlled. By providing a low-ohmic base at low frequencies, the bias circuit 130 helps to move the breakdown level of the main-transistor (Q0) 140 towards the fundamental limit of BVces=BVcbo (where BVces is the Breakdown Voltage between Collector and Emitter with shorted base, and BVcbo is the Breakdown Voltage between Collector and Base with open emitter).

The second-bias-transistor (Q2) 160 can provide only the necessary amount of current to the main-base-terminal 122 of the main-transistor 120. Therefore, the bias-transistor-module 100 can operate efficiently without wasting power. In particular, large currents, which would dissipate high powers, will not be provided when only a low amplitude input signal is provided to the module-input-terminal 102. Therefore, the circuit of FIG. 1 can be especially beneficial when an input signal has a low signal amplitude. In many examples of modern communication standards, signals may have high Peak-to-Average Ratio's (PARs). These high PARs result from increasing channel capacity by increasing modulation depth and using multiple carriers and/or subcarriers. In order to amplify these signals with sufficient linearity, power amplifiers may be operated substantially in back-off from their large-signal saturated power level.

The first-bias-transistor 140 has a first-inherent-capacitance 148 between the first-bias-emitter-terminal 146 and the first-bias-base-terminal 144. It will be appreciated that this is an inherent property of any such transistor and not a separate component. However, for ease of discussion, a first-inherent-capacitance 148 is shown in FIG. 1. The first-inherent-capacitance 148 may also be called a first-inherent-base-emitter-capacitance. Similarly, the second-bias-transistor 160 also has a second-inherent-capacitance 168 between the second-bias-emitter-terminal 166 and the second-bias-base-terminal 164. The second-inherent-capacitance 168 may also be called a second-inherent-base-emitter-capacitance.

The presence of the first-inherent-capacitance 148 and the second-inherent-capacitance 168 in the bias-circuit 130, as described above, advantageously enables the bias-circuit 130 to exhibit inductor-like behaviour. That is, a circuit containing capacitors 148, 168, transistors 140, 160, and resistors 150, 170 as shown in FIG. 1 can function as an inductance. In particular, the values of the first-bias-resistor (R1) 150 and the second-bias-resistor (R2) 170 can be chosen such that together with the inherent base-to-emitter capacitances 148, 168 of the first-bias-transistor (Q1) 140 and the second-bias-transistor (Q2) 160, they will operate to prevent or reduce unwanted Radio Frequency (RF) currents in the first-bias-transistor 140 and the second-bias-transistor 160. This inductor-like behaviour thereby eliminates or reduces a need for any physical inductors to reduce unwanted RF currents. Since the biased-transistor-module 100 may not require any physical inductors to sufficiently reduce RF current, the circuit can be made smaller, more compact, and cheaper to construct, than circuits that contain one or more physical inductors, without impairing, or causing deterioration of, performance. The more compact implementation that may be possible where physical inductors are avoided may enable an important benefit for the stability of power amplifiers because the power amplifiers can be split in parts. For example, a power amplifier may be divided into a plurality of power cells, that can be distributed across an integrated circuit, with each power cell being biased by its individual bias circuit. Individual biasing of each power cell may enable more precise control of a power amplifier, for example, each component part of the amplifier may be provided with a different bias voltage based on the particular temperature of each respective part of the power amplifier.

Also advantageously, the bias circuit 130 of FIG. 1 can be considered as a relatively simple circuit that can provide the bias current with sufficient accuracy over a range of temperatures. That is, complex circuits may not to be required. Therefore, any problems that may occur due to high power consumption of such complex circuits can be reduced or avoided.

In this example, the biased-transistor-module 100 also includes an input-capacitor 129 connected in series between the input-signal-node 128 and the module-input-terminal 102. The input-capacitor 129 operates to shield the input-signal-node 128 from any DC voltage or current present at the module-input-terminal 102. Since the input-capacitor 129 is connected between the input-signal-node 128 and the module-input-terminal 102, the input-capacitor 129 is not connected between the bias-circuit 130 and the main-base-terminal 122, therefore the input-capacitor 129 will not prevent the bias-circuit 130 from providing dc bias current to the main-base-terminal 122.

The arrangement of FIG. 1 enables the main-transistor 120 to be used for amplification of an electronic signal, and a pair of two bias-transistors 140, 160 in the bias circuit 130 can provide base current for the main-transistor 120 in two opposite directions. The main-transistor 120 has its base-terminal 122 connected to the collector 144 of one of the two bias-transistors 140, 160 and also to the emitter 166 of the other bias-transistor 160. The two bias-transistors 140, 160 can be smaller than the main-transistor 120. For example, where the main-transistor 120 has a main-area, the first-bias-transistor 140 has a first-area, and the second-bias-transistor 160 has a second-area, then the ratio of the main-area to the first-area can be greater than 2, 5, 10 or 20 and/or the ratio of the main-area to the second-area can be greater than 2, 5, 10 or 20. Having such a difference in size can be advantageous because it reduces the overall size of the biased-transistor-module 100 while still providing bias-transistors 140, 160 that are sufficiently powerful to provide an adequate bias voltage to the main-transistor 120. In particular, when the biased-transistor-module 100 is implemented on a silicon chip, the total area of silicon required for the components of the biased-transistor-module 100 may be reduced to provide for an advantageously compact package.

Figure 2:
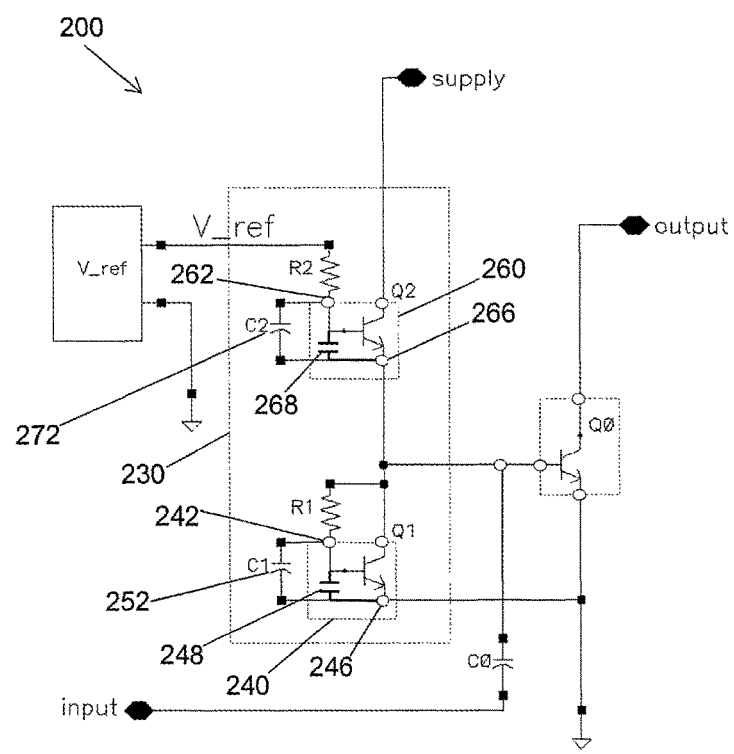
FIG. 2 shows an example embodiment of a biased transistor module, similar to that of FIG. 1, with two additional capacitors.

FIG. 2 shows an example embodiment of a biased-transistor-module 200. Features of FIG. 2 that are similar to features of FIG. 1 have been given similar reference numerals and may not necessarily be discussed further here.

The biased-transistor-module 200 has a first-additional-capacitor 252 connected between the first-bias-base-terminal 242 and the first-bias-emitter-terminal 246. The first-additional-capacitor 252 is an additional component that is external to the first-bias-transistor 240. The first-additional-capacitor 252 is connected in parallel with the first-inherent-capacitance 248, which thereby increases the capacitance of this part of the bias-circuit 230.

The biased-transistor-module 200 also has a second-additional-capacitor 272 connected between the second-bias-base-terminal 262 and the second-bias-emitter-terminal 266. The second-additional-capacitor 272 is an additional component that is external to the second-bias-transistor 260. The second-additional-capacitor 272 is connected in parallel with the second-inherent-capacitance 268, which thereby increases the capacitance of this part of the bias-circuit 230.

By increasing the capacitance of the bias-circuit 230 in this way, the first-additional-capacitor 252 and/or the second-additional-capacitor 272 can improve the inductor-like behaviour of the bias-circuit 230 and thereby operate more effectively to supress or reduce RF currents, and thereby to enable more efficient operation.

Figure 3:
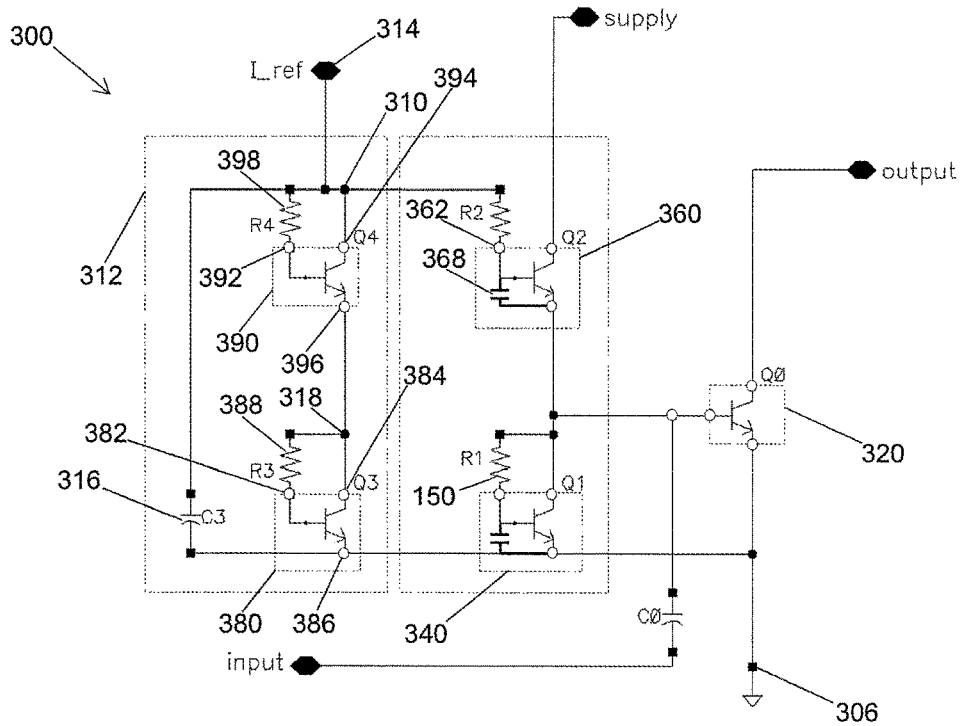
FIG. 3 shows an example embodiment of a biased transistor module, similar to that of FIG. 1, with further details of the reference voltage circuit.

FIG. 3 shows an example embodiment of a biased-transistor-module 300. Features of FIG. 3 that are similar to features of an earlier figure have been given similar reference numerals and may not necessarily be discussed further here.

The biased-transistor-module 300 shows an example implementation of a module-reference-voltage-source circuit 312 for providing a module reference voltage to a module-reference-voltage-terminal 310.

The module-reference-voltage-source circuit 312 has: a first-reference-transistor 380 having a first-reference-base-terminal 382, a first-reference-collector-terminal 384 and a first-reference-emitter-terminal 386; and a second-reference-transistor 390 having a second-reference-base-terminal 392, a second-reference-collector-terminal 394 and a second-reference-emitter-terminal 396. A reference-current-terminal 314 is also provided, which can receive an externally generated reference current for controlling the value of the module reference voltage provided at the module-reference-voltage-terminal 310.

The first-reference-collector-terminal 384 is connected to an intermediate-reference-node 318. The first-reference-emitter-terminal 386 is connected to the reference-terminal 306. The first-reference-base-terminal 382 is connected to the intermediate-reference-node 318, in this example through an optional first-reference-resistor 388 that is connected between the first-reference-base-terminal 382 and the intermediate-reference-node 318. The second-reference-emitter-terminal 396 is connected to the intermediate-reference-node 318. The second-reference-collector-terminal 394 is connected to the module-reference-voltage-terminal 310. The second-reference-base-terminal 392 is connected to the module-reference-voltage-terminal 310, in this example through an optional second-reference-resistor 398 that is connected between the second-reference-base-terminal 392 and the module-reference-voltage-terminal 310. The module-reference-voltage-terminal 310 is connected to the reference-current-terminal 314.

In other examples, the first-reference-base-terminal 382 may be connected to the intermediate-reference-node 318 by a short circuit. Also, the second-reference-base-terminal 392 may be connected to the module-reference-voltage-terminal 310 by a short circuit.

The first-reference-transistor 380 and the second-reference-transistor 390 are configured to stabilize the voltage on the terminals of the first-bias-transistor 340 and the second-bias-transistor 360. This stabilization is achieved by virtue of the forward diode voltage of the base-emitter junction. By determining the base voltage of the second-bias-transistor (Q2) 360, which defines the emitter voltage of the second-bias-transistor (Q2) 360 as current is conducted through the second-bias-transistor (Q2) 360, the collector voltage of the first-bias-transistor (Q1) 360 may be determined. The collector voltage of the first-bias-transistor (Q1) 340 may be determined in this way since the first-bias-transistor (Q1) 340 is connected to the emitter of the second-bias-transistor (Q2) 360, which defines the base voltage of the second-bias-transistor (Q2) 360. This is because the second-diode-transistor (Q2) 360 is diode-connected via the first-bias-resistor (R1) 350. The first-reference-transistor 380 and the second-reference-transistor 390 are similarly diode-connected transistors.

Figure 4:
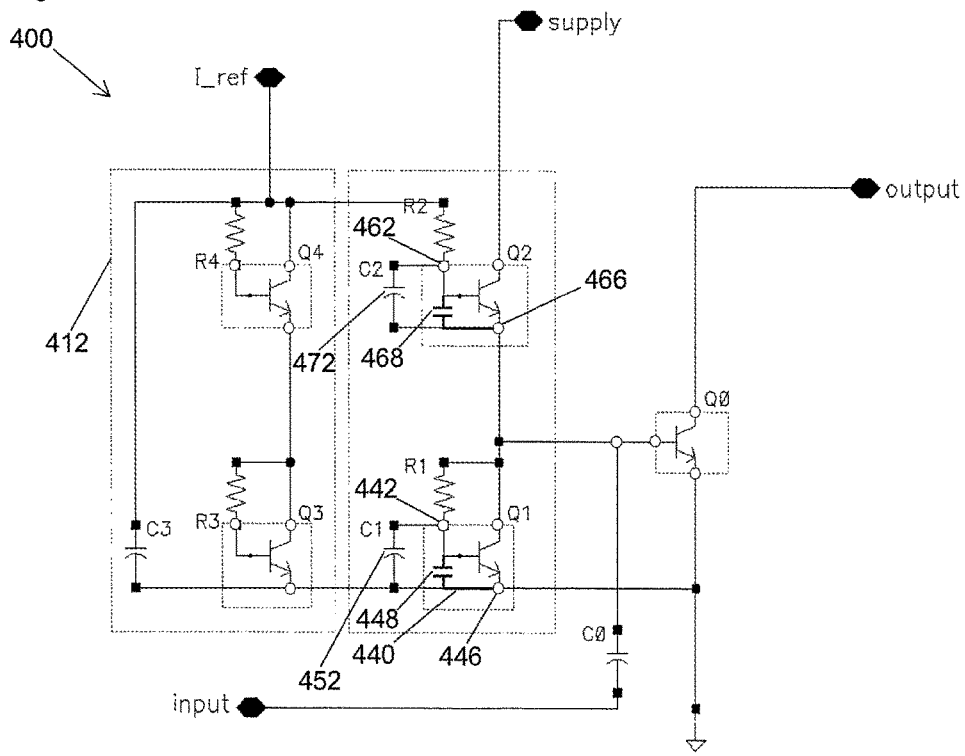
FIG. 4 shows an example embodiment of a biased transistor module, similar to that of FIG. 3, with two additional capacitors.

The module-reference-voltage-source circuit 312 also has a reference-capacitor 316 connected between the module-reference-voltage-terminal 310 and the first-reference-emitter-terminal 386. The reference-capacitor 316 is provided to decouple, or filter out, any noise/interference signals or cross-talk that may otherwise be introduced by the reference voltage into the RF signal path FIG. 4 shows an example embodiment of a biased-transistor-module 400. Features of FIG. 4 that are similar to features of an earlier figure have been given similar reference numerals and may not necessarily be discussed further here.

The biased-transistor-module 400 of FIG. 4 includes a module-reference-voltage-source circuit 412 that is the same as the corresponding component of FIG. 3, and also includes a first-additional-capacitor 452 and a second-additional-capacitor 472 that are the same as the corresponding components of FIG. 2.

Figure 5:
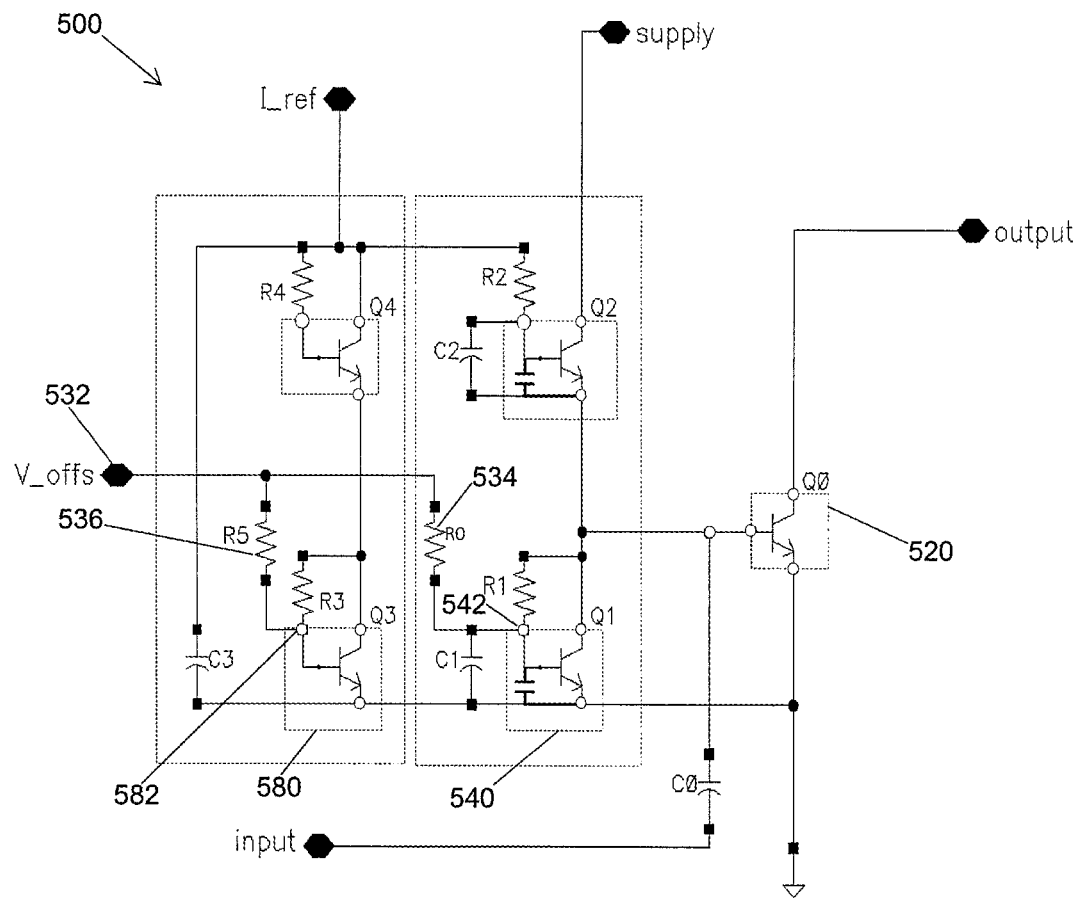
FIG. 5 shows an example embodiment of a biased transistor module, similar to that of FIG. 4, with an additional voltage offset circuit.

FIG. 5 shows an example embodiment of a biased-transistor-module 500. Features of FIG. 5 that are similar to features of an earlier figure have been given similar reference numerals and may not necessarily be discussed further here.

The biased-transistor-module 500 has a voltage-offset-terminal 532, which is connected to the first-bias-base-terminal 542 through an optional first-offset-resistor 534. The voltage-offset-terminal 532 is also connected to the first-reference-base-terminal 582 through an optional second-offset-resistor 536. The voltage-offset-terminal 532 is configured to provide an offset voltage to the biased-transistor-module 500. More particularly, an offset voltage is provided to the first-reference-base-terminal 582 of the first-reference-transistor 580, and also to the first-bias-base-terminal 542 of the first-bias-transistor 540.

Use of such an offset voltage can enable additional control over the operating point of the main-transistor (Q0) 520 by setting an appropriate offset voltage. The use of such offset voltages may be particularly advantageous for signal amplification in class C modes of operation of an amplifier circuit. It may also be particularly advantageous in Doherty amplifiers with a class AB main power amplifier working together with a class C peaking power amplifier. In such examples, the offset may be used to set the take-over point where the peaking power amplifier starts to assist the main power amplifier in delivering power to the load. This offset can be dynamically set, for example, in accordance with the power level delivered to the load, or the offset may be made dependent on the supply voltage, or the temperature, of the Doherty amplifier to make it more robust in relation to variations of supply voltage or temperature, respectively. Generally, the offset voltage will usually, although not necessarily, be used to reduce the bias current in the main-transistor (Q0) 520. Increasing the voltage on the voltage-offset-terminal 532 may lower the bias current in the main transistor (Q0) 520.

Figure 6:
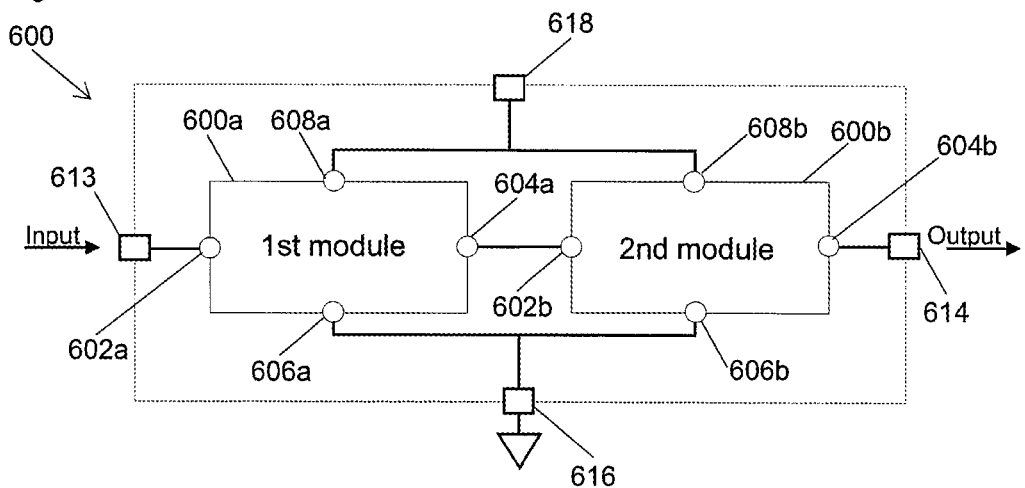
FIG. 6 shows an example embodiment of a system comprising a plurality of biased transistor modules coupled together.

FIG. 6 shows a system 600 consisting of a first-biased-transistor-module 600a and a second-biased-transistor-module 600b. It will be appreciated that a system may comprise a plurality of the biased-transistor-modules of the present disclosure, containing two or more such biased-transistor-modules.

The system 600 has: a system-supply-terminal 618; a system-reference-terminal 616, which in this case is connected to electrical ground; a system-input-terminal 613; and a system-output-terminal 614.

The first-biased-transistor-module 600a has a first-module-supply-terminal 608a, a first-reference-terminal 606a, a first-module-input-terminal 602a and a first-module-output-terminal 604a. Similarly, the second-biased-transistor-module 600b has a second-module-supply-terminal 608b, a second-reference-terminal 606b, a second-module-input-terminal 602b and a second-module-output-terminal 604b. In this example: the first- and second-module-supply-terminals 608a, 608b are connected to the system-supply-terminal 618; and the first- and second-reference-terminals 606a, 606b are connected to the system-reference-terminal 616. More generally, where a plurality of biased-transistor-modules are present in a system, each module-supply-terminal, of each of the plurality of biased-transistor-modules, may be connected to the system-supply-terminal 618, and each reference-terminal, of each of the plurality of biased-transistor-modules, may be connected to the system-reference-terminal 616.

In this example, the first-module-input-terminal 602a is connected to the system-input-terminal 613, and the second-module-output-terminal 604b is connected to the system-output-terminal 614. The first-module-output-terminal 604a is connected to the second-module-input-terminal 602b. In this way, the first-biased-transistor-module 600a and the second-biased-transistor-module 600b are connected in cascade between the system-input-terminal 612 and the system-output-terminal 614. It will be appreciated that, in other embodiments, a plurality of biased-transistor-modules may be connected in parallel with each other between the system-input-terminal 612 and the system-output-terminal 614.

For example, in a system comprising a Doherty amplifier, a first plurality of biased-transistor-modules may be connected in cascade to provide a main-amplification-pathway, a second plurality of biased-transistor-modules may be connected in cascade to provide a peaking-amplification-pathway. The main-amplification-pathway may be connected in parallel with respect to the peaking-amplification-pathway, to thereby provide the Doherty amplifier.

Since the bias circuit of each biased-transistor-module can be configured to operate independently of any other biased-transistor-module in the system, each biased-transistor-module may be individually configured to provide for increased efficiency. For example, each bias circuit may be configured based on a temperature measured by a sensor thermally coupled to each respective main-transistor. Since different transistors operating at different temperatures may operate more efficiently by using different bias voltages, systems of the present disclosure may be configured to provide for improved efficiency.

Generally, one or more biased-transistor-modules of the present disclosure may be used to provide electronic amplifiers. A specific application is the amplification of high-frequency signals to high power levels for transmitting radio signals. In particular, biased-transistor-modules may be employed in small-cell base stations, or any other type of telecommunications base station, to provide amplified electronic signalling in the radio frequency domain. In such applications, embodiments comprising Doherty amplifiers may be particularly efficient.

In the above description, biased-transistor-modules have been described as comprising bipolar junction transistors (BJTs). However, it will be appreciated that biased-transistor-modules may also comprise Field Effect Transistors (FETs) or other suitable active devices. The three terminals of a bipolar junction transistor may be described as a base-terminal, a collector-terminal and an emitter-terminal. Generally, any base-terminal disclosed herein is an example of a control-terminal, any collector-terminal disclosed herein is an example of a first-conduction-channel-terminal, and any emitter-terminal disclosed herein is an example of a second-conduction-channel-terminal. In a Field Effect Transistor, the gate-terminal is an example of a control-terminal, the drain-terminal can be an example of a first-conduction-channel-terminal and the source-terminal can be an example of a second conduction-channel-terminal.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A biased-transistor-module comprising:
a module-input-terminal;
a module-output-terminal;
a reference-terminal;
a module-supply-terminal configured to receive a supply voltage;
a module-reference-voltage-terminal configured to receive a module reference voltage;
a main-transistor having a main-control-terminal, a main-first-conduction-channel-terminal and a main-second-conduction-channel-terminal, wherein the main-first-conduction-channel-terminal is connected to the module-output-terminal, and the main-second-conduction-channel-terminal is connected to the reference-terminal, and the main-control-terminal is connected to an input-signal-node, wherein the input-signal-node is connected to the module-input-terminal; and
a bias-circuit comprising:
a first-bias-transistor having a first-bias-control-terminal, a first-bias-first-conduction-channel-terminal and a first-bias-second-conduction-channel-terminal;
a first-bias-resistor;
a second-bias-transistor having a second-bias-control-terminal, a second-bias-first-conduction-channel-terminal and a second-bias-second-conduction-channel-terminal; and
a second-bias-resistor;
wherein:
the first-bias-first-conduction-channel-terminal is connected to the input-signal-node;
the first-bias-second-conduction-channel-terminal is connected to the reference-terminal;
the first-bias-resistor is connected between the first-bias-first-conduction-channel-terminal and the first-bias-control-terminal;
the second-bias-second-conduction-channel-terminal is connected to the input-signal-node;
the second-bias-first-conduction-channel-terminal is connected to the module-supply-terminal; and
the second-bias-resistor is connected between the second-bias-control-terminal and the module-reference-voltage-terminal; and
further comprising a first-additional-capacitor connected between the second-bias-control-terminal and the second-bias-second-conduction-channel-terminal.

2. The biased-transistor-module of claim 1, further comprising a second-additional-capacitor connected between the first-bias-control-terminal and the first-bias-second-conduction-channel-terminal.

3. The biased-transistor-module of claim 1, further comprising:
a first-reference-transistor having a first-reference-control-terminal, a first-reference-first-conduction-channel-terminal and a first-reference-second-conduction-channel-terminal;
a second-reference-transistor having a second-reference-control-terminal, a second-reference-first-conduction-channel-terminal and a second-reference-second-conduction-channel-terminal; and
a reference-current-terminal,
wherein:
the first-reference-first-conduction-channel-terminal is connected to an intermediate-reference-node;
the first-reference-second-conduction-channel-terminal is connected to the reference-terminal;
the first-reference-control-terminal is connected to the intermediate-reference-node;
the second-reference-second-conduction-channel-terminal is connected to the intermediate-reference-node;
the second-reference-first-conduction-channel-terminal is connected to the module-reference-voltage-terminal;
the second-reference-control-terminal is connected to the module-reference-voltage-terminal; and
the module-reference-voltage-terminal is connected to the reference-current-terminal.

4. The biased-transistor-module of claim 3,
further comprising a reference-capacitor connected between the module-reference-voltage-terminal and the first-reference-second-conduction-channel-terminal.

5. The biased-transistor-module of claim 3,
further comprising a first-reference-resistor connected between the first-reference-control-terminal and the intermediate-reference-node.

6. The biased-transistor-module of claim 3,
further comprising a second-reference-resistor connected between the second-reference-control-terminal and the module-reference-voltage-terminal.

7. The biased-transistor-module of claim 3,
further comprising a voltage-offset-terminal connected to the first-bias-control-terminal, wherein the voltage-offset-terminal is configured to provide an offset voltage to the biased-transistor-module.

8. The biased-transistor-module of claim 7,
further comprising a first-offset-resistor connected between the voltage-offset-terminal and the first-bias-control-terminal.

9. The biased-transistor-module of claim 7,
further comprising a second-offset-resistor connected between the voltage-offset-terminal and the first-reference-control-terminal.

10. The biased-transistor-module of claim 1, wherein
the main-transistor comprises a main-area, the first-bias-transistor comprises a first-area and the second-bias-transistor comprises a second-area, and:
the ratio of the main-area to the first-area is greater than 2; or
the ratio of the main-area to the second-area is greater than 2.

11. The biased-transistor-module of claim 1,
further comprising an input-capacitor connected in series between the input-signal-node and the module-input-terminal.

12. The biased-transistor-module of claim 1 wherein the first-bias-transistor is configured to provide current to cancel an avalanche current generated by the main-transistor.

13. A system comprising:
a plurality of the biased-transistor-modules of claim 1;
a system-supply-terminal;
a system-reference-terminal;
a system-input-terminal; and
a system-output-terminal,
wherein:
 each module-supply-terminal, of each of the plurality of biased-transistor-modules, is connected to the system-supply-terminal;
 each reference-terminal, of each of the plurality of biased-transistor-modules, is connected to the system-reference-terminal;
 each of the plurality of the biased-transistor-modules is connected in cascade or parallel between the system-input-terminal and the system-output-terminal.

14. A Class-C amplifier, or a Doherty amplifier, comprising the biased-transistor-module of claim 1.

15. A biased-transistor-module comprising:
a module-input-terminal;
a module-output-terminal;
a reference-terminal;
a module-supply-terminal configured to receive a supply voltage;
a module-reference-voltage-terminal configured to receive a module reference voltage;
a main-transistor having a main-control-terminal, a main-first-conduction-channel-terminal and a main-second-conduction-channel-terminal, wherein the main-first-conduction-channel-terminal is connected to the module-output-terminal, and the main-second-conduction-channel-terminal is connected to the reference-terminal, and the main-control-terminal is connected to an input-signal-node, wherein the input-signal-node is connected to the module-input-terminal; and
a bias-circuit comprising:
 a first-bias-transistor having a first-bias-control-terminal, a first-bias-first-conduction-channel-terminal and a first-bias-second-conduction-channel-terminal;
 a first-bias-resistor;
 a second-bias-transistor having a second-bias-control-terminal, a second-bias-first-conduction-channel-terminal and a second-bias-second-conduction-channel-terminal; and
 a second-bias-resistor;
wherein:
 the first-bias-first-conduction-channel-terminal is connected to the input-signal-node;
 the first-bias-second-conduction-channel-terminal is connected to the reference-terminal;
 the first-bias-resistor is connected between the first-bias-first-conduction-channel-terminal and the first-bias-control-terminal;
 the second-bias-second-conduction-channel-terminal is connected to the input-signal-node;
 the second-bias-first-conduction-channel-terminal is connected to the module-supply-terminal; and
 the second-bias-resistor is connected between the second-bias-control-terminal and the module-reference-voltage-terminal; and
further comprising a first-additional-capacitor connected between the first-bias-control-terminal and the first-bias-second-conduction-channel-terminal.

16. A biased-transistor-module comprising:
a module-input-terminal;
a module-output-terminal;
a reference-terminal;
a module-supply-terminal configured to receive a supply voltage;
a module-reference-voltage-terminal configured to receive a module reference voltage;
a main-transistor having a main-control-terminal, a main-first-conduction-channel-terminal and a main-second-conduction-channel-terminal, wherein the main-first-conduction-channel-terminal is connected to the module-output-terminal, and the main-second-conduction-channel-terminal is connected to the reference-terminal, and the main-control-terminal is connected to an input-signal-node, wherein the input-signal-node is connected to the module-input-terminal; and
a bias-circuit comprising:
 a first-bias-transistor having a first-bias-control-terminal, a first-bias-first-conduction-channel-terminal and a first-bias-second-conduction-channel-terminal;
 a first-bias-resistor;
 a second-bias-transistor having a second-bias-control-terminal, a second-bias-first-conduction-channel-terminal and a second-bias-second-conduction-channel-terminal; and
 a second-bias-resistor;
wherein:
 the first-bias-first-conduction-channel-terminal is connected to the input-signal-node;
 the first-bias-second-conduction-channel-terminal is connected to the reference-terminal;
 the first-bias-resistor is connected between the first-bias-first-conduction-channel-terminal and the first-bias-control-terminal;
 the second-bias-second-conduction-channel-terminal is connected to the input-signal-node;
 the second-bias-first-conduction-channel-terminal is connected to the module-supply-terminal; and
 the second-bias-resistor is connected between the second-bias-control-terminal and the module-reference-voltage-terminal; and
further comprising:
a first-reference-transistor having a first-reference-control-terminal, a first-reference-first-conduction-channel-terminal and a first-reference-second-conduction-channel-terminal;
a second-reference-transistor having a second-reference-control-terminal, a second-reference-first-conduction-channel-terminal and a second-reference-second-conduction-channel-terminal; and
a reference-current-terminal,
wherein:
 the first-reference-first-conduction-channel-terminal is connected to an intermediate-reference-node;
 the first-reference-second-conduction-channel-terminal is connected to the reference-terminal;
 the first-reference-control-terminal is connected to the intermediate-reference-node;
 the second-reference-second-conduction-channel-terminal is connected to the intermediate-reference-node;

the second-reference-first-conduction-channel-terminal is connected to the module-reference-voltage-terminal;

the second-reference-control-terminal is connected to the module-reference-voltage-terminal; and the module-reference-voltage-terminal is connected to the reference-current-terminal.

\* \* \* \* \*